United States Patent
Sato et al.

(10) Patent No.: US 6,740,888 B2
(45) Date of Patent: May 25, 2004

(54) ELECTRON BEAM APPARATUS

(75) Inventors: Mitsuyoshi Sato, Chiba (JP); Akira Yonezawa, Chiba (JP); Seiji Morita, Chiba (JP)

(73) Assignee: SII NanoTechnology Inc., Chiba (JP)

( * ) Notice: Subject to any disclaimer, the term of this patent is extended or adjusted under 35 U.S.C. 154(b) by 0 days.

(21) Appl. No.: 10/438,040

(22) Filed: May 14, 2003

(65) Prior Publication Data

US 2003/0218135 A1 Nov. 27, 2003

(30) Foreign Application Priority Data

May 15, 2002 (JP) ........................................ 2002-140122

(51) Int. Cl.[7] .......................... H01J 3/14; H01J 37/244; H01J 37/28; H01J 49/00
(52) U.S. Cl. .................... 250/396 R; 250/283; 250/310; 250/311; 250/396 ML; 250/397; 250/398; 250/399; 37/28; 37/244
(58) Field of Search ................... 250/283, 310, 250/311, 396 R, 396 ML, 397–399; 37/28, 244

(56) References Cited

U.S. PATENT DOCUMENTS

| | | | | |
|---|---|---|---|---|
| 4,831,266 A | * | 5/1989 | Frosien et al. | 250/397 |
| 5,389,428 A | * | 2/1995 | Fleming et al. | 428/209 |
| 5,629,526 A | * | 5/1997 | Nakasuji | 250/396 ML |
| 6,037,589 A | * | 3/2000 | Yonezawa et al. | 250/310 |
| 6,504,164 B2 | * | 1/2003 | Yonezawa et al. | 250/492.3 |
| 6,535,094 B2 | * | 3/2003 | Murata et al. | 336/83 |
| 2001/0011702 A1 | * | 8/2001 | Yonezawa et al. | 250/283 |
| 2003/0150991 A1 | * | 8/2003 | Kazumori | 250/310 |
| 2003/0218135 A1 | * | 11/2003 | Sato et al. | 250/396 R |

* cited by examiner

Primary Examiner—John R. Lee
Assistant Examiner—Bernard Souw
(74) Attorney, Agent, or Firm—Adams & Wilks

(57) ABSTRACT

In order to ensure that an electromagnetic field lens is capable of high-resolution observation using a magnetic field lens without leakage of magnetic flux, there is provided a magnetic field superimposing-type lens 1 for focusing an electron beam onto a sample 3 so as to irradiate the sample 3 is provided with an upper magnetic pole 213 a long way from the sample 3 and a lower side magnetic pole 214 close to the sample 3, with electrical insulation being provided between the upper magnetic pole 213 and the lower magnetic pole 214 by a ferrite insulator 215 provided between the upper magnetic pole 213 and the lower magnetic pole 214 in an integral manner with the magnetic poles so that the upper magnetic pole 213 and the lower magnetic pole 214 may be held at different potentials. There is therefore no leak in flux from between the upper magnetic pole 213 and the lower-magnetic pole 214, the chromatic aberration coefficient Cc can be made small, and high-resolution observation of the sample can be achieved.

8 Claims, 8 Drawing Sheets

ELECTRON BEAM APPARATUS

BACKGROUND OF THE INVENTION

1. Field of the Invention

The present invention relates to an electron beam apparatus capable of monitoring at high-resolution.

2. Description of Related Art

For example, in order to perform inspection or observation of the shape of a fine pattern electronic device, conventionally, various electron beam devices such as scanning electron microscopes etc. have been used, and in particular, there has been a high demand for high resolution observation as a result of electronic devices becoming ultra fine in recent years. In Japanese Patent Laid-open Publication No. 2001-185066, there is proposed an electron beam apparatus capable of high-resolution observation provided with an electromagnetic field compound lens capable of applying a negative potential to both a magnetic pole close to a sample for the magnetic lens and to the sample.

It is well-known that a chromatic aberration coefficient Cc becomes large as the distance between the position of an electrically insulating member such as ceramic etc. and the tip of a magnetic pole applying a potential, i.e. as the distance between the position of the electrically insulating member and the surface facing the sample, becomes larger. With the electromagnetic field compound lens of the electron beam apparatus proposed in Japanese Laid-open Publication No. 2001-185066, electrically insulating material for maintaining a high-voltage at tapered magnetic pole tips is provided at a position away from a surface facing the sample of the magnetic poles. The distance between the position of the electrically insulating member of ceramic etc. and the surface facing the sample of the magnetic pole is therefore substantial, and the chromatic aberration coefficient Cc is therefore large. Providing electrical insulating material in order to prevent charging by the electron beam in the vicinity of the opposing surface of the sample for the magnetic pole close to the sample is spatially difficult. Magnetic flux therefore leaks into a magnetic gap due to the electrically insulating member and a sub-lens magnetic field therefore exists displaced from a main lens magnetic field on the optical axis. This is therefore detrimental to image resolution at low acceleration voltages.

In order to resolve these problems, in a further practical example, there is proposed in Japanese Patent Laid-open Publication 2001-185066 an electron beam apparatus where a sample is placed within a magnetic field formed in the vicinity of a magnetic pole positioned at the side of an electron source. The electron source-side magnetic pole is partitioned into a magnetic pole far from the sample and a magnetic pole close to the sample. The top surface of the magnetic pole far from the sample is positioned closer to the sample than an electrically insulating material provided between the magnetic pole far from the sample and the magnetic pole close to the sample. The magnetic field occurring between the magnetic pole far from the sample and the magnetic pole close to the sample is positioned in the vicinity of the part of the magnetic pole close to the sample that faces the sample. Magnetic flux can therefore be prevented from leaking and chromatic aberration coefficient Cc of a compound lens can be made smaller.

However, with the electron beam apparatus proposed in Japanese Patent Laid-open Publication 2001-185066, there is a problem in that the magnetic poles face each other and that discharges therefore occur at high-voltages of over 1 kV or more when the intervening gap is made too small. When the gap between the magnetic poles is made small in order to avoid this, another problem occurs in that a sub-magnetic field occurring as a result becomes large and it is therefore easy for the chromatic aberration coefficient Cc therefore to become large.

SUMMARY OF THE INVENTION

According to the present invention, in an electron beam apparatus having an electromagnetic field lens for focusing an electron beam onto a sample so as to irradiate the sample, an electromagnetic circuit of the electromagnetic field lens is provided with an upper magnetic pole far from the sample and a lower magnetic pole near to the sample, with electrical insulation being provided between the upper magnetic pole and the lower magnetic pole by a ferrite insulator provided between the upper side magnetic pole and the lower side magnetic pole in an integral manner with the magnetic poles so that the upper magnetic pole and the lower magnetic pole can be held at different potentials.

DETAILED DESCRIPTION OF THE INVENTION

One example of an embodiment of the present invention will be described in more detail in the following with reference to the drawings.

Figure 1:
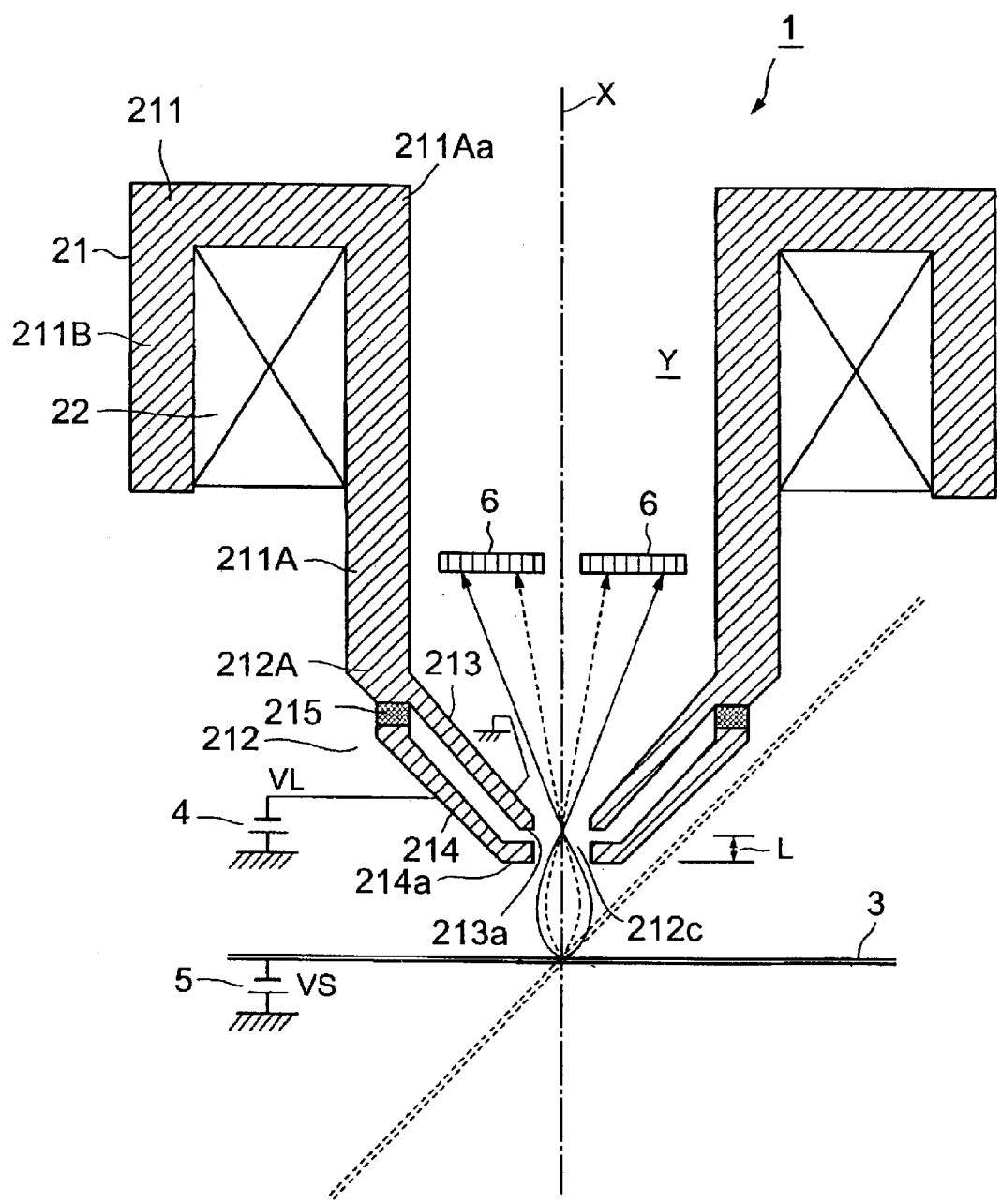
FIG. 1 is a cross sectional view showing one example of an embodiment of a magnetic field superimposing-type lens of the present invention.

FIG. 1 is a cross-sectional view of an example of an embodiment of a magnetic field superimposing-type lens of the present invention provided in an electron beam apparatus (not shown). An electric field superimposing type single pole magnetic field lens 1 is configured as an objective lens of an electronic apparatus such as a scanning electron microscope etc. used in scanning and observation of the shapes of fine pattern electronic devices and subjects an electron beam 1 (not shown) advancing along an optical axis X to the focusing action of a magnetic field, and superimposes a decelerating electric field on the magnetic field so as to reduce the chromatic aberration coefficient of the lens, in order to give an electrostatic magnetic compound lens capable of performing high-resolution image observation.

The magnetic field superimposing-type lens 1 is formed with an excitation coil 22 provided at a magnetic circuit 21, with the magnetic circuit 21 being formed integrally with a yoke 211 and magnetic pole 212. The yoke 211 is provided at the advancement side of the electron beam advancing along the direction of the optical axis X. An overhanging portion 211B L-shaped in cross-section is integrally formed so as to extend radially outwards at an end edge 211Aa of a cylindrical body 211A forming a cylindrical path Y through-which the electron beam passes. The excitation coil 22 is housed within an annular space formed by the body 211A and the overhanging portion 211B.

On the other hand, the magnetic pole 212 is formed as a truncated pot-shape, with a large diameter opening edge 212A constituting one end of the magnetic pole 212 being fixed to the body 211A of the yoke 211. The magnetic pole 212 is partitioned into an upper magnetic pole 213 far away from the sample 3 and a lower magnetic pole 214 close to the sample 3. The two magnetic poles 213 and 214 are then connected via an insulator 215 made from the ferrite insulator that is an electrically insulating material.

The insulator 215 is a cylindrical member corresponding to the size and shape of the large diameter opening edge 212A of the magnetic pole 212, with the lower magnetic pole 214 being formed integrally with the large diameter opening edge 212A of the magnetic pole 212 via the insulator 215. The top surface 213a of the upper magnetic pole 213 is configured so as to be positioned closer to the sample 3 than the insulator 215 provided between the upper magnetic pole 213 and the lower magnetic pole 214. A through-hole 212C for allowing an electron beam to pass is therefore provided on the same axis as the optical axis X by the top surface 213a of the upper magnetic pole 213 and a top surface 214a of the lower magnetic pole 214.

A magnetic field for focusing can therefore be formed in a vicinity of the lower magnetic pole top surface 214 when a current flows in the excitation coil 22 because the magnetic field superimposing-type lens 1 is configured in the above manner. An electron beam advancing towards the magnetic field superimposing-type lens 1 along the optical axis X from an electron gun (not shown) can therefore be subjected to focusing action due to the magnetic field.

The upper magnetic pole 213 is earthed, a negative potential VL (for example, −1 kV) is applied by a high-voltage supply 4 to the lower magnetic pole 214 and a negative potential VS (for example, −1 kV) is applied by a high-voltage supply 5 to the sample 3. A decelerating electric field can therefore be generated between the upper magnetic pole 213 and the lower magnetic pole 214, so that a magnetic field superimposing-type lens, capable of superimposing this decelerating electric field on the focusing magnetic field due to the magnetic field superimposing-type lens 1, is configured.

The earth potential portion of the magnetic field superimposing-type lens 1 is connected to a chamber (not shown) at the earth potential. The lower magnetic pole 214 and the sample 3 to which a negative potential is applied are located in the chamber that is maintained at a vacuum. An electron beam generated from an electron gun (not shown) and incident along the direction of the optical axis X is subjected to the focusing action due to the magnetic field generated by the magnetic field superimposing-type lens 1 and to the decelerating electric field action generated by the upper magnetic pole 213 and the lower magnetic pole 214 to be focused onto the sample 3, and at the same time, the electron beam scans the observational surface of the sample 3 using a scanning deflector (not shown) The secondary electrons generated by the sample 3 are detected by a secondary electron detector 6 arranged at the upper part of the magnetic field superimposing-type lens 1. It is possible here to make the negative potential VL applied to the lower magnetic pole 214 and the negative potential VS applied to the sample 3 equal, so that there is no magnetic field turbulence occurring due to the sample 3 being inclined, which enables high resolution observation even when the sample 3 is inclined at a large angle.

In the magnetic field superimposing-type lens 1, the position distant from the top surface 214a of the tapered lower magnetic pole 214 can be easily provided with the insulator 215 and the magnetic field generated between the upper magnetic pole 213 and the lower magnetic pole 214 is positioned in the vicinity of surface of the lower magnetic pole 214 facing the sample. This, therefore makes the chromatic aberration coefficient Cc of the magnetic field superimposing-type lens 1 small.

Also, the magnetic field superimposing-type lens 1 is made from ceramic in the related art, but it is also possible to use ferrite as an insulator 215. Volume resistivity p of ceramic is large at approximately $10^{10}$ Ω·m, but its relative permeability is small and an equal level to that in a vacuum state. Therefore, in the case of using ceramic, electronic isolation is good, but magnetic flux tends to leak easily into a magnetic gap due to the electrically insulating member. However, volume resistivity p of the ferrite insulator used in the magnetic field superimposing-type lens 1 is in the range of 1 Ω·m to $10^5$ Ω·m and there are therefore some ferrite insulators having good electronic isolation, and its relative permeability is also from a number of hundred to a number of tens of thousand, and capable of preventing magnetic flux from leaking. As a result, chromatic aberration coefficient Cc can be reduced and which enables high resolution observation.

Figure 2:
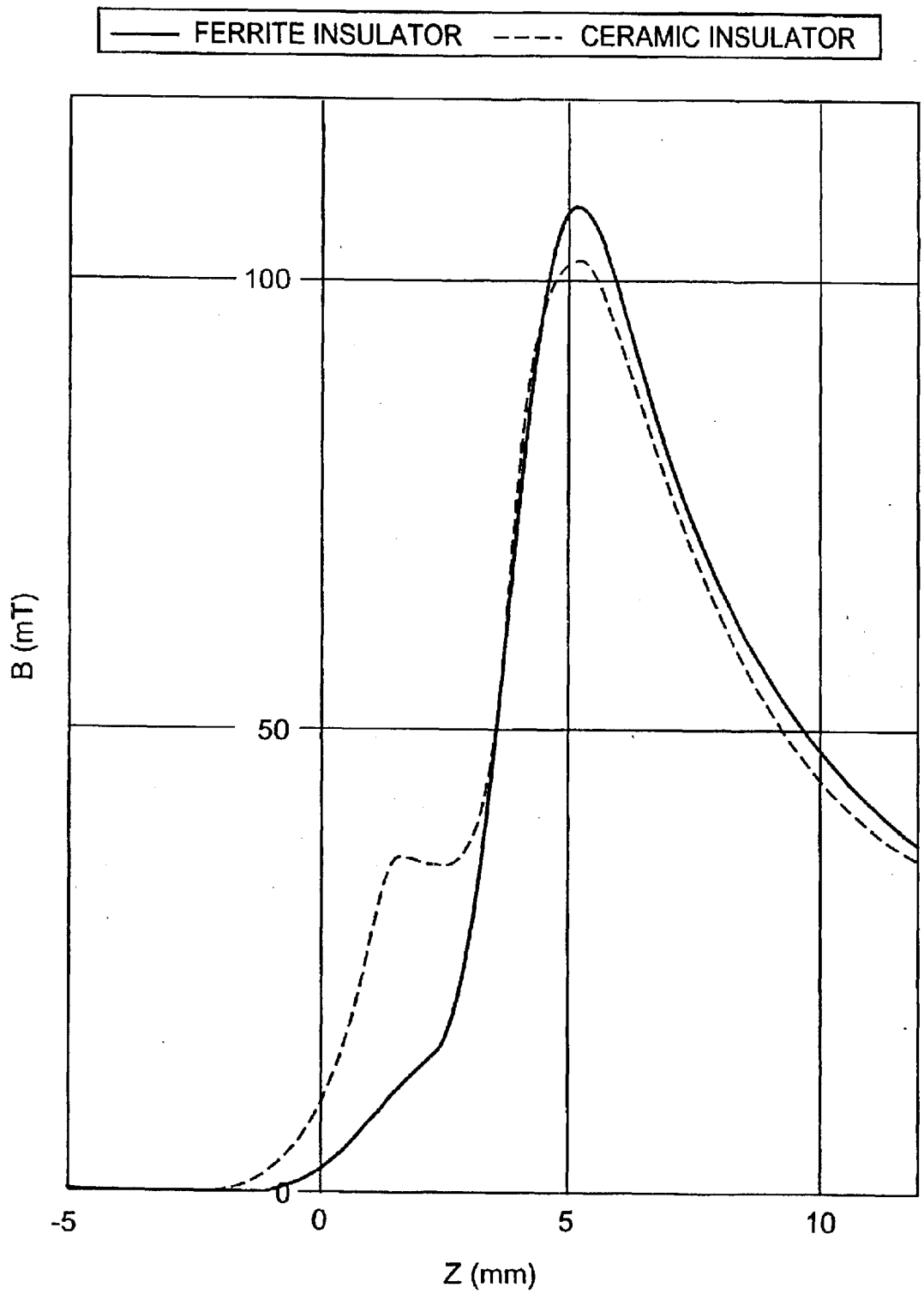
FIG. 2 is a graph illustrating magnetic flux density distribution with respect to distance along the direction of the optical axis in either a case of a ferrite insulator being used or a case of ceramic insulator being used as an insulator of the magnetic field superimposing-type lens shown in FIG. 1.

FIG. 2 illustrates the distribution of magnetic flux density B(mT) with respect to the distance Z(mm) along the direction of the optical axis in either of an electron beam apparatus using ferrite insulator as an insulator of the magnetic field superimposing-type lens shown in FIG. 1 or an electron beam apparatus provided with a magnetic field superimposing-type lens using ceramic insulator as an insulator 215.

In either case of a lens using a ferrite insulator or a lens using a ceramic insulator, the gap between the upper magnetic pole 213 and the lower magnetic pole 214 is set to 2 mm, A distance L between the center of the gap and the surface of the lower magnetic pole 214 facing the sample 3 is set to 2 mm and magnetic field lens strength is set to 1260AT. It is found that when a ceramic insulator is used, there is a small sub-peak present in Bz (left side Z=2 mm), while on the other hand, when a ferrite insulator is used, there is almost no sub-peak in Bz and the size of the main peak (left side Z=5 mm) increases. The chromatic aberration coefficient Cc is therefore small because there is almost no sub-peak in Bz and high resolution can therefore be achieved.

Figure 3:
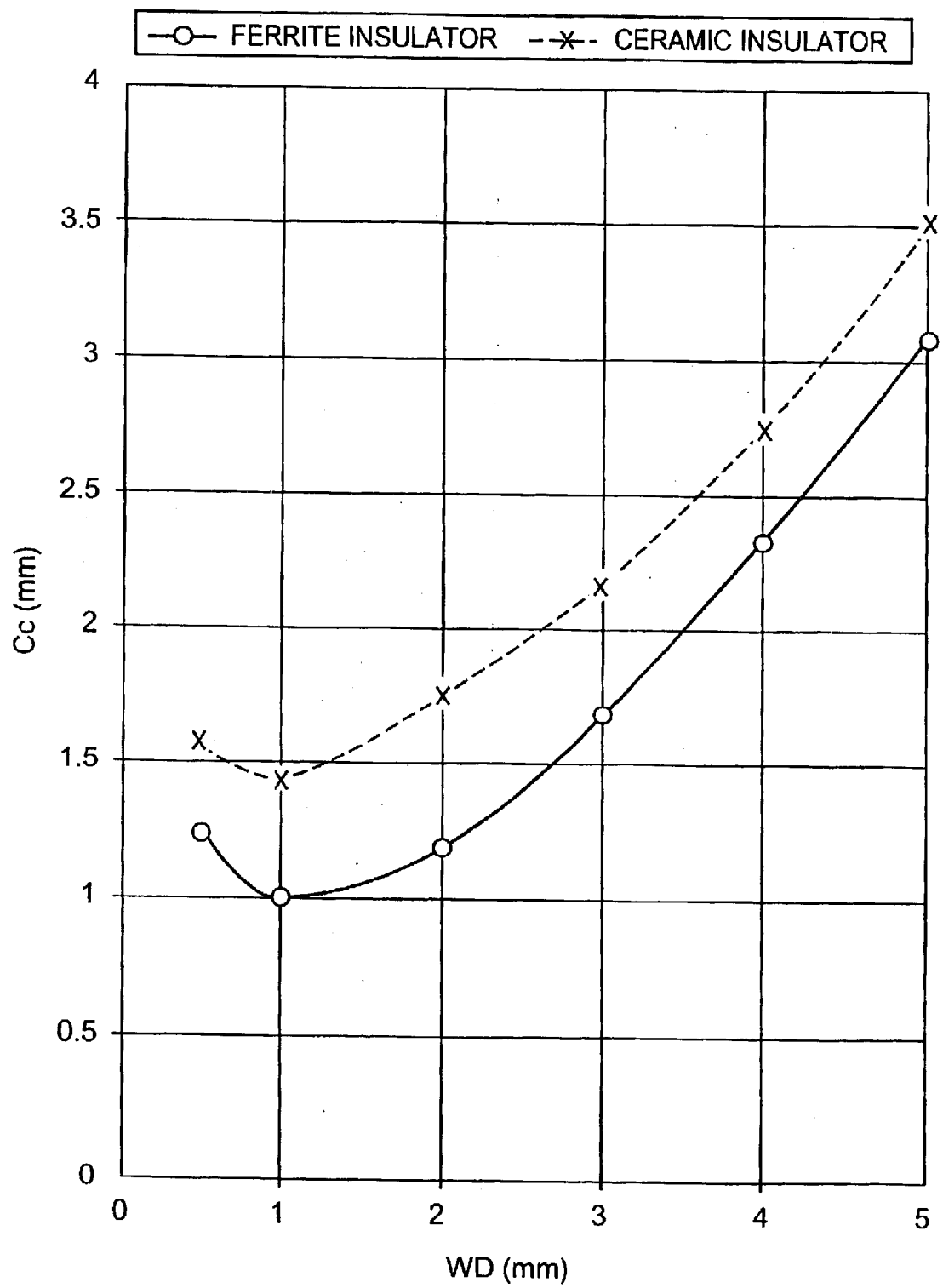
FIG. 3 is a graph showing calculated value examples of characteristics of chromatic aberration coefficient in either case of a ferrite insulator being used or a ceramic insulator being used as an insulator of the magnetic field superimposing-type lens shown in FIG. 1.

FIG. 3 shows examples of calculated values of chromatic aberration coefficient Cc, which control image resolution at low accelerating voltages in an electron beam apparatus provided with the magnetic field superimposing-type lens shown in FIG. 1 or a magnetic field superimposing-type lens using a ceramic insulator for the insulator 215 of the magnetic field superimposing-type lens, with respect to WD (the distance between the top surface 214a of the lower magnetic pole 214 and the sample 3). The electron orbit of an electrostatic bi-potential field is obtained and chromatic aberration coefficient Cc is calculated using the Bz distribution shown in FIG. 2. It is however possible to set the voltage of an electron gun to 2 kV and the voltage between the lower magnetic pole 214 and the sample 3 to −1 kV. The same conditions as for the case shown in FIG. 2 are used in the case of either lens, and the incident voltage to the sample is set to 1 kV.

According to the diagram shown in FIG. 3, chromatic aberration coefficient Cc in the case where a ferrite insulator is used is smaller than that in the case using a ceramic insulator, so clearly image resolution is improved.

Figure 4:
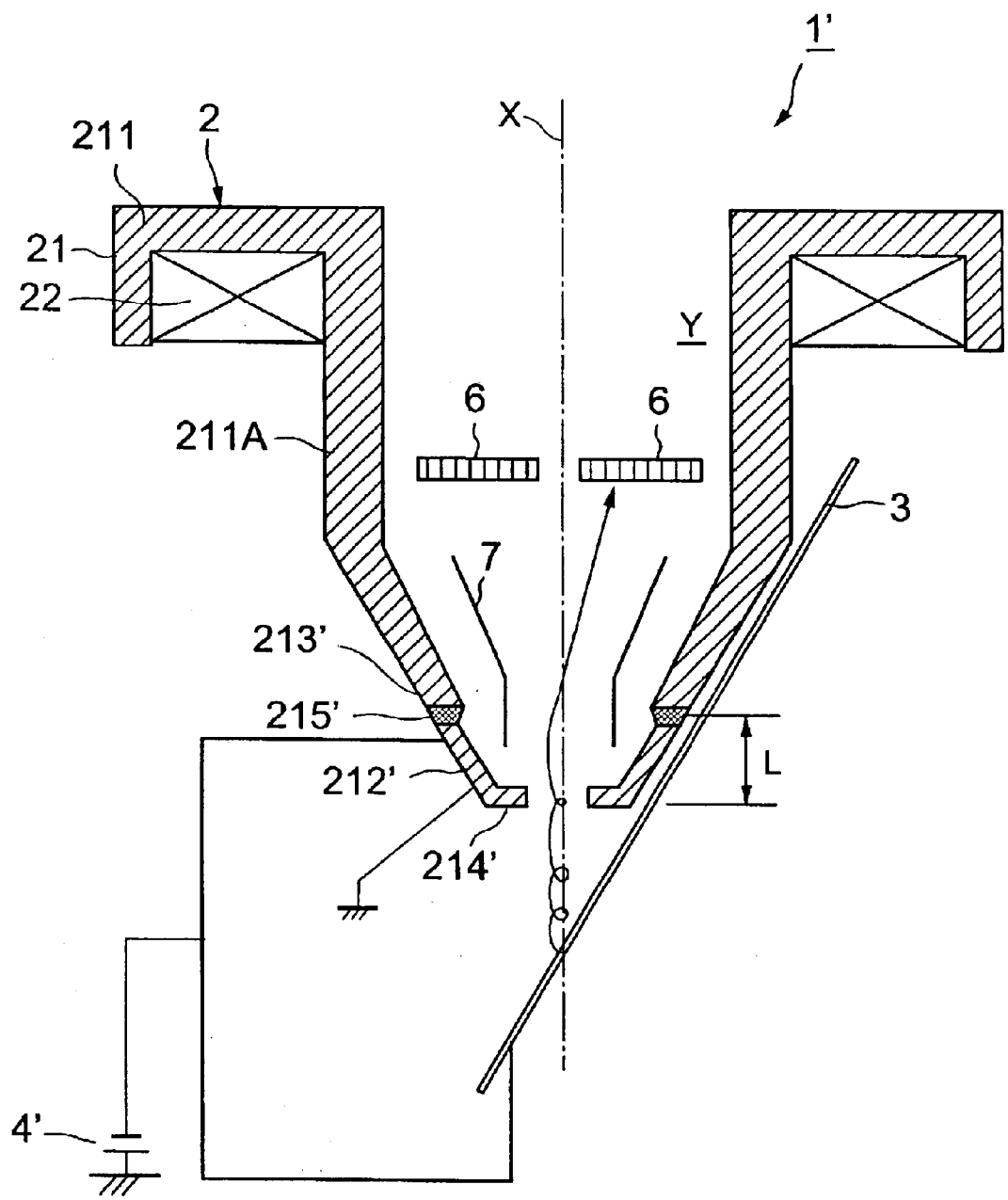
FIG. 4 is a cross sectional view showing another embodiment of an insulator of the magnetic field superimposing-type lens of the present invention.

FIG. 4 is a cross sectional view showing another embodiment of a magnetic field superimposing-type lens provided in the electron apparatus (not shown) of the present invention. A magnetic field superimposing-type lens 1' shown in FIG. 4 is different from the one shown in FIG. 1 only in that the top surface of the upper magnetic pole 213' does not extend closer toward the lower magnetic pole 214' than the position of the insulator 215'. The same numerals are therefore used for the sections in FIG. 4, that correspond to those in FIG. 1, and the descriptions for those sections are omitted.

Figure 5:
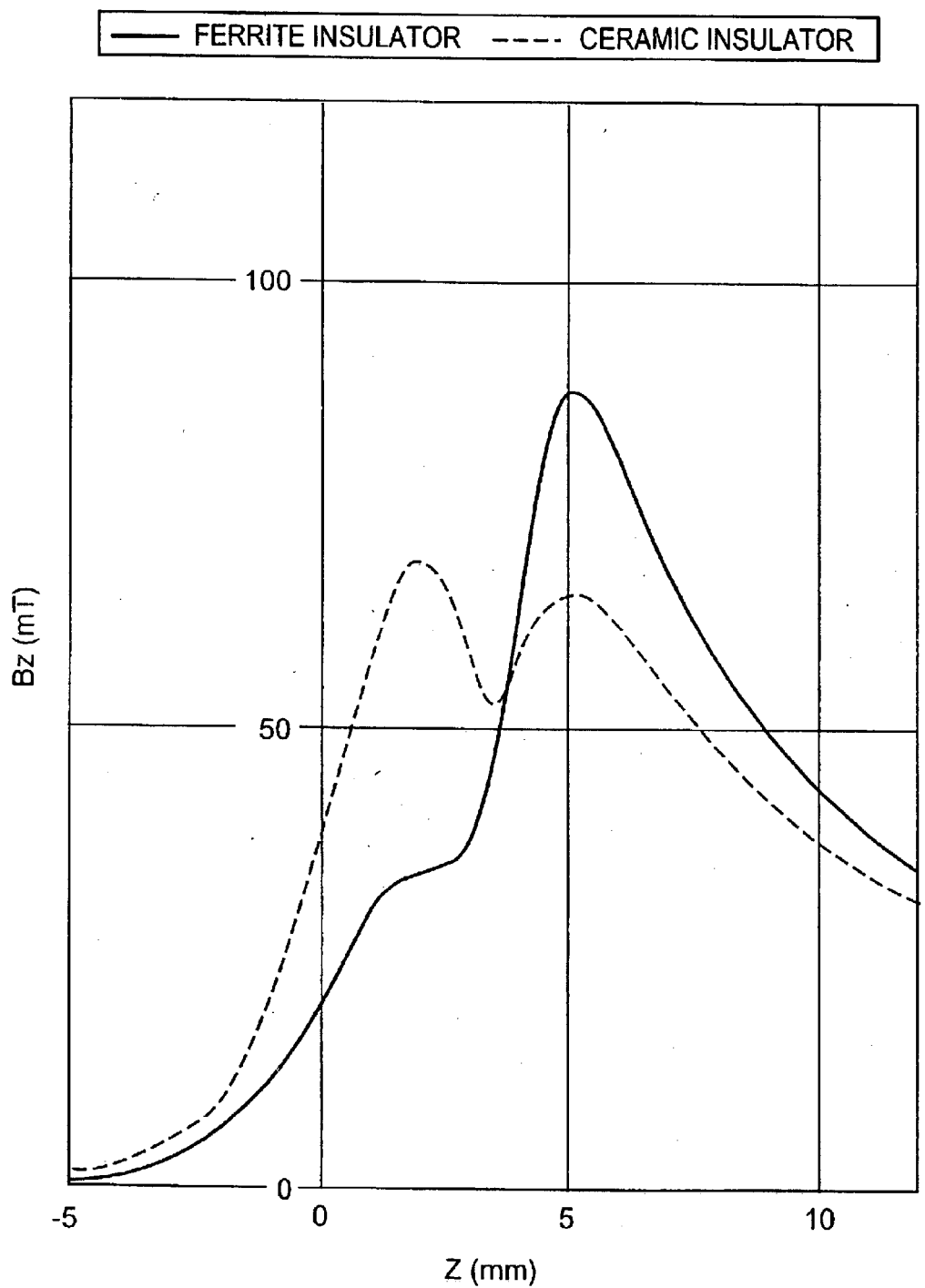
FIG. 5 is a graph illustrating magnetic flux density distribution with respect to distance along the direction of the optical axis in a case of ferrite insulator being used or a case of ceramic insulator being used as an insulator of the magnetic field superimposing-type lens shown in FIG. 1.

FIG. 5 shows the distribution of magnetic flux density B(mT) with respect to each distance Z(mm) along the direction of the optical axis in either of an electron beam apparatus provided with the magnetic field superimposed-type lens using a ferrite insulator as the insulator 215' shown in FIG. 4 or an electron beam apparatus provided with a magnetic field superimposed-type lens using a ceramic insulator as an insulator 215'.

In the case of either a lens using a ferrite insulator or a lens using a ceramic insulator, the gap between the upper magnetic pole 213' and the lower magnetic pole 214' is set to 2 mm, distance L between the center of the gap and the surface of the lower magnetic pole 214' facing the sample 3 is set to 2 mm, and magnetic field lens strength is set to 1260AT. Accordingly, it is found that when a ceramic insulator is used as an insulator 215', the size of a sub-peak in Bz (left side Z=2 mm) is larger than that of the main peak in Bz (left side Z=5 mm), while on the other hand, when a ferrite-insulator is used, the sub-peak in Bz is lowered and the size of the main peak in Bz (left side Z=5 mm) increases.

Figure 6:
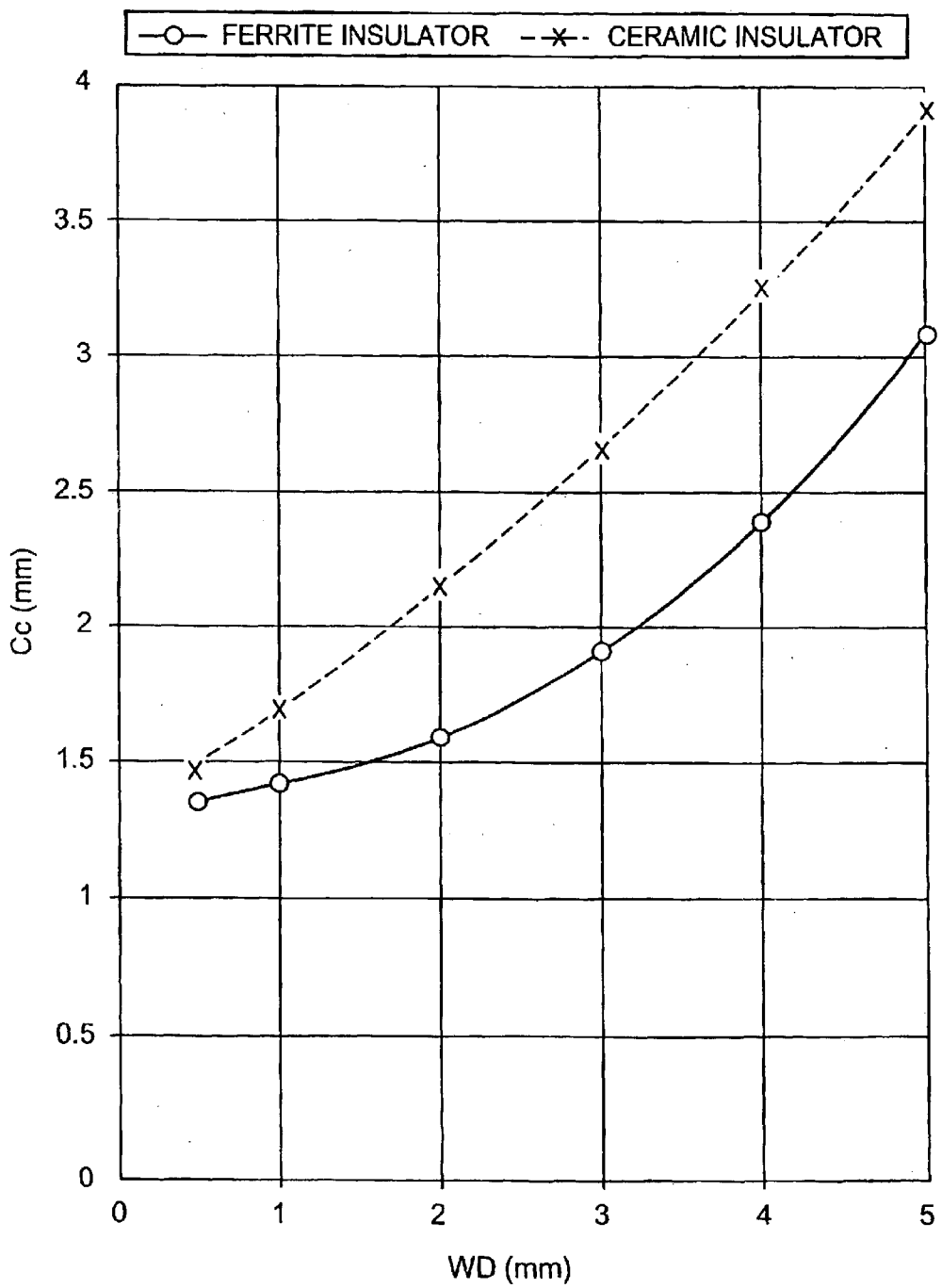
FIG. 6 is a graph showing calculated value examples of characteristics of chromatic aberration coefficient in a case of a ferrite insulator being used or a case of ceramic insulator being used as an insulator of the magnetic field superimposing-type lens shown in FIG. 1.

FIG. 6 shows examples of calculated value of chromatic aberration coefficient Cc, which controls image resolution at low accelerating voltages in cases of a lens using a ferrite insulator and a lens using a ceramic insulator shown in FIG. 5 or a magnetic field superimposing-type lens using a ceramic insulator for the insulator 215 of the magnetic field superimposing-type lens, with respect to WD (the distance between the top surface 214'a of the lower magnetic pole 214' and the sample 3). The electron orbit on electrostatic bi-potential field is obtained and chromatic aberration coefficient Cc is calculated using the Bz distribution shown in FIG. 5. It is however possible to set the voltage of an electron gun to 2 kV and the potential of an upper electrode 7 and the upper magnetic pole 213' to earth potential, and the potential for the lower magnetic pole 214' and the sample 3 to −1 kV. The same conditions as for the case shown in FIG. 5 are used in the case of either lens, and the voltage incident to the sample is set to 1 kV.

According to the diagram shown in FIG. 6, chromatic aberration coefficient Cc in the case where a ferrite insulator is used is smaller than that in the case using a ceramic insulator, so clearly image resolution is improved.

Figure 7:
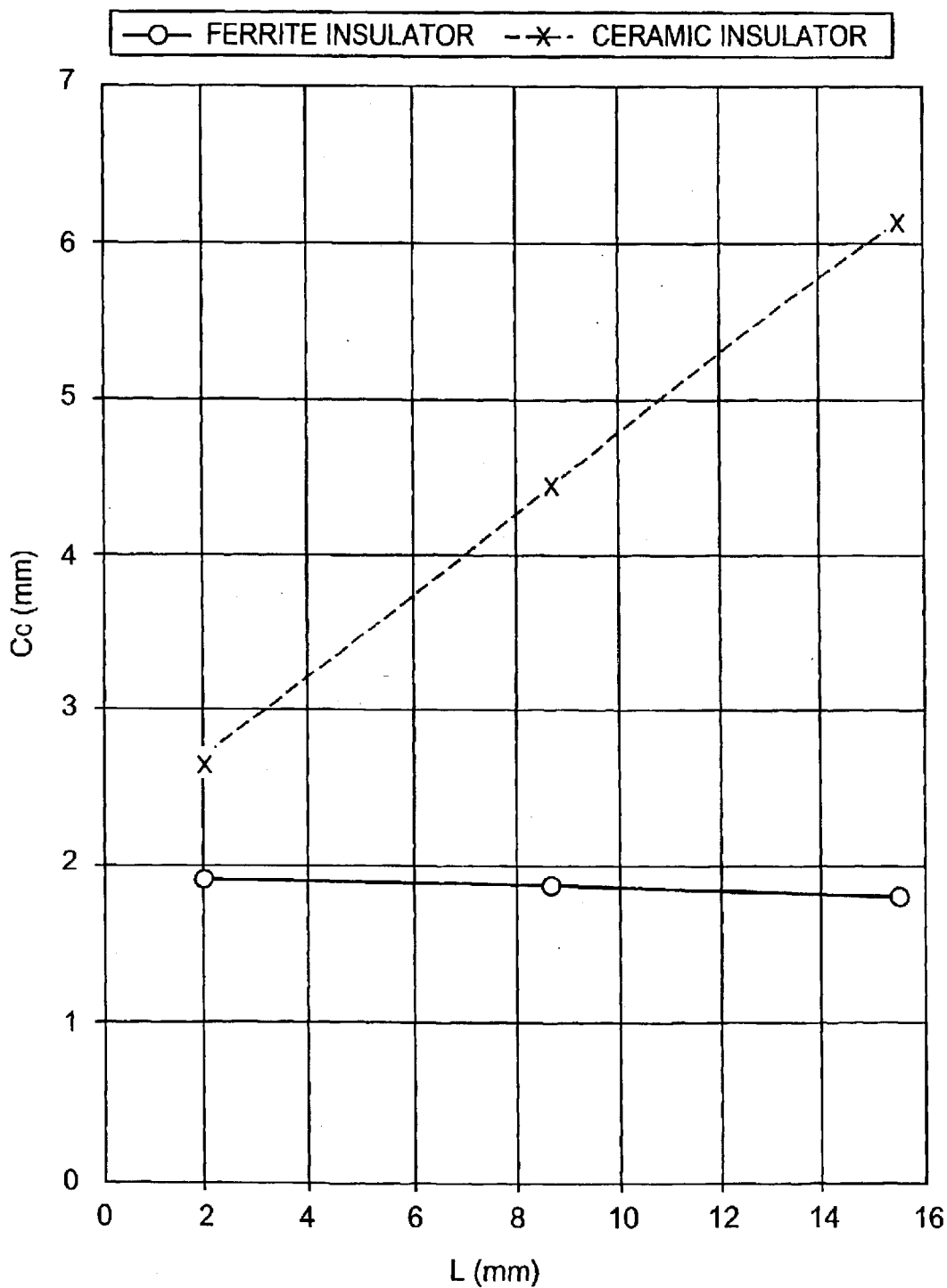
FIG. 7 is a graph showing calculated value examples of characteristics of chromatic aberration coefficient with respect to distance between the top surface of a lower magnetic pole and an insulator in either case of a ferrite insulator being used or a ceramic insulator being used as an insulator of the magnetic field superimposing-type lens shown in FIG. 1.

FIG. 7 is a graph showing chromatic aberration coefficient, using WD as a parameter, with respect to the distances L of a magnetic field superimposing-type lens in a case of using a ferrite glass (should be "insulator") or the other case of using a ceramic insulator for the insulator 215' of the magnetic field superimposing-type lens 1' shown in FIG. 4. The same conditions as for the case shown in FIG. 5 are used in the case of either lenses.

According to the diagram shown in FIG. 7, in the case of using a ceramic insulator, the value of chromatic aberration coefficient Cc becomes large if the value of distance L expressing the position of the insulator is large. Even if an attempt is made to make the distance L less than 2 (mm) in order to avoid this, it is spatially difficult to realize. On the other hand, it is found that in the case of using a ferrite insulator, the value of chromatic aberration coefficient Cc does not rely on the value of distance L. Namely, when a ferrite insulator is used, the value of chromatic aberration coefficient Cc does not become large even if distance L is large. It is therefore clear from this that image resolution is not deteriorated even when distance L is large.

Figure 8:
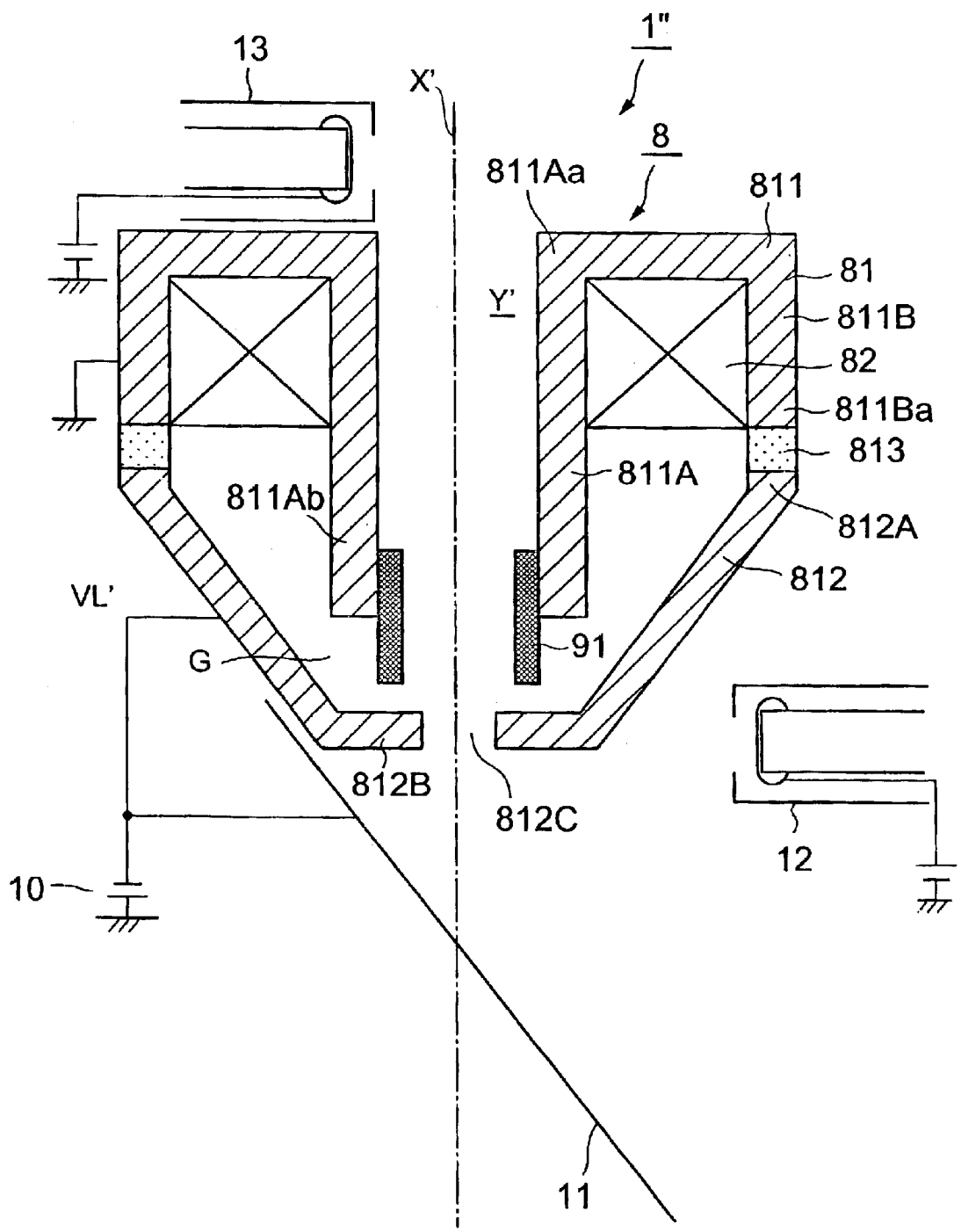
FIG. 8 is a cross sectional view showing a further embodiment of a magnetic field superimposing-type lens of the present invention.

In FIG. 8, a cross sectional view is shown of another embodiment of a magnetic field superimposing-type lens provided in the electronic apparatus (not shown) of the present invention. The magnetic field superimposing-type lens 1" shown in FIG. 8 is an out-lens type magnetic lens and is configured by incorporating an electrical field bi-potential lens comprising an earth 91 and a lower magnetic pole tip 812B into an electromagnetic lens 8 and is an electrostatic magnetic compound lens configured so as to enable observation of high-resolution images by giving focusing action of a magnetic field due to the electromagnetic lens 8 to an electron beam (not shown) advancing along an optical axis X and superimposing a decelerating electric field due to the electrical field bi-potential lens with the magnetic field so as to reduce the chromatic aberration coefficient of the lens.

An electromagnetic lens 8 is comprised of a magnetic circuit 81 with an excitation coil 82 provided thereon. The magnetic circuit 81 has a yoke portion 811 and a magnetic pole 812, and the yoke portion 811 and the magnetic pole 812 are integrated via an insulator 813 that is an electrically insulating material. The yoke 811 is provided at the advancement side of the electron beam advancing along the direction of the optical axis X'. An overhanging portion 811B L-shaped in cross-section is integrally formed so as to extend radially outwards at an end edge 811Aa of a cylindrical body 811A forming a cylindrical path Y' throughwhich the electron beam passes. The excitation coil 82 is housed within an annular space formed by the body 811A and the overhanging portion 811B.

On the other hand, the magnetic pole 812 is formed as a truncated pot-shape, with a large diameter opening edge 812A constituting one end of the magnetic pole 812 being fixed to the tip 811Ba of the overhanging portion 811B via the insulator 813 that is an electrically insulating material. The tip 812B of the magnetic pole 812 faces the other edge of the body 811A from a prescribed distance to form a magnetic gap G. The tip 812B is provided with a throughhole 812C allowing an electron beam to pass on the same axis as the optical axis X'.

One of electrodes of an electrical field bi-potential lens is made from a non-magnetic conductive material and has a cylindrical earth electrode 91 of such a size that the outer diameter corresponds to the size of the internal diameter of the body 811A. One end 91A of the earth electrode 91 is fitted to the other end 811Ab of the body 811A as shown in the figure and the earth electrode 91 is fixed to the magnetic circuit 81 by being electrically connected with the yoke 811. The other end 91B of the earth 91 faces the tip 812B of the magnetic pole 812 with a prescribed distance between them.

The magnetic circuit 81 is earthed and a negative potential VL (for example, −1 kV) is applied by a high-voltage supply 10 to the magnetic pole 812. A decelerating electric field can therefore be generated between the earth electrode 91 and the tip 812B, so that a magnetic field superimposing-type lens, capable of superimposing this decelerating electric field on the focusing magnetic field due to the electromagnetic lens 8, is configured. As will be understood from the above description, a bi-potential lens is configured so that the earth electrode 91 and the tip 812B function as a pair of an electrical field bi-potential lens.

The earth potential portion of the magnetic field superimposing-type lens 1″ is connected to a chamber (not shown) at earth potential. The magnetic pole 812 and the sample 11 to which the negative potential is applied are located in the chamber maintained at a vacuum. An electron beam generated from an electron gun (not shown) and incident along the direction of the optical axis X' is subjected to the focusing action due to the magnetic field generated at the magnetic gap G of the electromagnetic lens 8 and to the decelerating electric field action generated by the electrical field bi-potential lens, and is focused onto the sample 11. At the same time, the electron beam scans the observational surface of the sample 11 using a scanning deflector (not shown) The secondary electrons generated by the sample 11 is detected by a secondary electron detector 12 arranged in the lateral direction of the magnetic field superimposing-type lens 1″ or by a secondary electron detector 13 arranged at the upper part of the magnetic field superimposing-type lens 1' Negative potential VL applied to the magnetic pole 812 here is exactly the same as the negative potential VL applied to the sample 11, so that there is no of magnetic field turbulence occurring due to the sample 11 being inclined, which enables high resolution observation even with the sample 11 inclined at a large angle.

A ferrite insulator having good electrical insulation properties and large relative permeability is used for the insulator 813 in the magnetic field superimposing-type lens 1″ and it is therefore possible for magnetism to transmit to prevent magnetic flux from leaking. Therefore, reduction of chromatic aberration coefficient Cc and high resolution observation can be expected in the magnetic field superimposing-type lens 1'.

According to the present invention, an insulator is provided made from a ferrite insulator having good electrical insulation properties and large relative permeability provided at a position away from the surface of the lower magnetic pole of an electromagnetic lens constituting a magnetic field superimposing-type lens. It is therefore possible for magnetism to transmit to prevent magnetic flux from leaking. It is therefore possible to reduce chromatic aberration coefficient Cc and to have a high resolution observation.

What is claimed is:

1. An electron beam apparatus having an electromagnetic field lens for focusing an electron beam onto a sample so as to irradiate the sample, wherein an electromagnetic circuit of the electromagnetic field lens comprises an upper magnetic pole far from the sample and a lower magnetic pole near to the sample, with electrical insulation being provided between the upper magnetic pole and the lower magnetic pole by a ferrite insulator provided between the upper magnetic pole and the lower magnetic pole in an integral manner with the magnetic poles so that the upper magnetic pole and the lower magnetic pole can be held at different potentials.

2. The electron beam apparatus according to claim 1, wherein the upper magnetic pole and the lower magnetic pole are provided at an end part at the side of the sample of the electromagnetic circuit.

3. The electron beam apparatus according to claim 2, wherein the upper magnetic pole is formed integrally as a part extending from the electromagnetic circuit, with an end of this integrally extending part becoming narrower towards the sample.

4. The electron beam apparatus according to claim 3, wherein an opening enabling the electron beam to pass is formed at the tip of the integrally extending part.

5. The electron beam apparatus according to claim 3, wherein the lower magnetic pole is a funnel-shaped member provided so as to surround the outer periphery of the upper magnetic pole.

6. The electron beam apparatus according to claim 5, wherein the ferrite insulator is provided as an annular member at an upper edge of the lower magnetic pole, and the lower magnetic pole is provided at the upper magnetic pole via the annular member.

7. The electron beam apparatus according to claim 3, wherein the lower magnetic pole is fitted to the tip of the integrally extending part via the ferrite insulator.

8. The electron beam apparatus according to claim 7, wherein an opening enabling the electron beam to pass is formed at the tip of the lower magnetic pole.

* * * * *